(12) United States Patent
Harada et al.

(10) Patent No.: US 8,198,675 B2
(45) Date of Patent: Jun. 12, 2012

(54) SILICON CARBIDE SEMICONDUCTOR DEVICE AND METHOD OF MANUFACTURING THE SAME

(75) Inventors: Shin Harada, Osaka (JP); Takeyoshi Masuda, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 449 days.

(21) Appl. No.: 12/515,386

(22) PCT Filed: Nov. 16, 2007

(86) PCT No.: PCT/JP2007/072290
§ 371 (c)(1),
(2), (4) Date: May 18, 2009

(87) PCT Pub. No.: WO2008/062729
PCT Pub. Date: May 29, 2008

(65) Prior Publication Data
US 2010/0314626 A1    Dec. 16, 2010

(30) Foreign Application Priority Data
Nov. 21, 2006    (JP) .................................. 2006-314014

(51) Int. Cl.
*H01L 29/161* (2006.01)
(52) U.S. Cl. .................... 257/330; 257/77; 257/E21.06; 257/E21.066; 257/E29.118; 438/478
(58) Field of Classification Search .................... 438/478
See application file for complete search history.

(56) References Cited

U.S. PATENT DOCUMENTS

| 5,976,936 A | * | 11/1999 | Miyajima et al. ............. 438/268 |
| 6,020,600 A | * | 2/2000 | Miyajima et al. ............... 257/76 |
| 6,057,558 A | | 5/2000 | Yamamoto et al. |

(Continued)

FOREIGN PATENT DOCUMENTS
EP    0 962 963 A1    12/1999
(Continued)

OTHER PUBLICATIONS

Starke et al., "SiC Surface Reconstruction: Relevancy of Atomic Structure for Growth Technology", Surface Review and Letters, vol. 6, No. 6, pp. 1129-1141 (1999).

*Primary Examiner* — Nathan W. Ha
*Assistant Examiner* — Abul Kalam
(74) *Attorney, Agent, or Firm* — Venable LLP; Michael A. Sartori; Christopher Ma

(57) ABSTRACT

A silicon carbide semiconductor device having excellent performance characteristics and a method of manufacturing the same are obtained. An extended terrace surface is formed at a surface of an initial growth layer on a 4H—SiC substrate by annealing with the initial growth layer covered with an Si film, and then a new growth layer is epitaxially grown on the initial growth layer. A 3C—SiC portion having a polytype stable at a low temperature is grown on the extended terrace surface, and a 4H—SiC portion is grown on the other region. A trench is formed by selectively removing the 3C—SiC portion with the 4H—SiC portion remaining, and a gate electrode of a UMOSFET is formed in the trench. A channel region of the UMOSFET can be controlled to have a low-order surface, and a silicon carbide semiconductor device having high channel mobility and excellent performance characteristics is obtained.

9 Claims, 4 Drawing Sheets

U.S. PATENT DOCUMENTS

| | | | |
|---|---|---|---|
| 6,097,039 A * | 8/2000 | Peters et al. | 257/77 |
| 6,573,534 B1 * | 6/2003 | Kumar et al. | 257/77 |
| 6,995,396 B2 * | 2/2006 | Takahashi et al. | 257/77 |
| 7,365,363 B2 * | 4/2008 | Kojima et al. | 257/77 |
| 2003/0080384 A1 | 5/2003 | Takahashi et al. | |
| 2004/0159841 A1 * | 8/2004 | Hisada et al. | 257/77 |
| 2005/0230686 A1 | 10/2005 | Kojima et al. | |

FOREIGN PATENT DOCUMENTS

| | | |
|---|---|---|
| JP | 9-102459 | 4/1997 |
| JP | 10-125904 | 5/1998 |
| JP | 11-162850 | 6/1999 |
| JP | 2003-234301 | 8/2003 |
| JP | 2004-152813 | 5/2004 |
| JP | 2005-56868 | 3/2005 |
| JP | 2005-97040 | 4/2005 |
| JP | 2005-277229 | 10/2005 |
| JP | 2005-340685 | 12/2005 |
| JP | 2006-13005 | 1/2006 |
| JP | 2006-344942 | 12/2006 |

* cited by examiner (a)

(b)

(c)

(a)

(b)

SILICON CARBIDE SEMICONDUCTOR DEVICE AND METHOD OF MANUFACTURING THE SAME

TECHNICAL FIELD

The present invention relates to a silicon carbide semiconductor device including an extended terrace portion and a method of manufacturing the same.

BACKGROUND ART

Semiconductor devices such as transistors or diodes formed by using a silicon carbide substrate (SiC substrate) where Si and C are bonded at a component ratio of 1:1 are expected to be put to practical use as power devices. Since silicon carbide is a wide band gap semiconductor and a breakdown electric field thereof is an order of magnitude higher than that of silicon, a high reverse breakdown voltage can be maintained even if the thickness of a depletion layer in a pn junction or a Schottky junction is reduced. Thus, the use of the silicon carbide substrate allows the thickness of the device to be reduced and a doping concentration to be increased. Therefore, it is expected that a low-loss power device having low on-resistance and high breakdown voltage will be realized. A substrate having a 4H or 6H polytype is generally used as the silicon carbide substrate, and in order to achieve smooth epitaxial growth, a substrate having a main surface offset at approximately 8° with respect to a {0001} surface is used.

Vertical MOSFETs (Metal Oxide Semiconductor Field Effect Transistors) where a current is vertically flown in order that a surface of a silicon carbide layer may be effectively used are the mainstream in MOSFETs formed by using a silicon carbide substrate. One of the vertical MOSFETs that are known is a so-called UMOSFET (that is also referred to as a trench-type MOSFET) having a trench formed in a part of a silicon carbide layer and a gate electrode formed in the trench. This is a transistor where a channel region is provided vertically. Examples of the UMOSFET are disclosed, for example, in Japanese Patent Laying-Open No. 10-125904 (Patent Document 1), Japanese Patent Laying-Open No. 2005-56868 (Patent Document 2) and Japanese Patent Laying-Open No. 2005-340685 (Patent Document 3).

Patent Document 1: Japanese Patent Laying-Open No. 10-125904
Patent Document 2: Japanese Patent Laying-Open No. 2005-56868
Patent Document 3: Japanese Patent Laying-Open No. 2005-340685

DISCLOSURE OF THE INVENTION

Problems to be Solved by the Invention

In power devices that are the mainstream in silicon carbide semiconductor devices, a silicon carbide substrate of a 4H or 6H polytype having a hexagonal crystal structure is used. In this case, a silicon carbide substrate having a main surface offset at approximately 8° with respect to a {0001} surface is used. The reason is, for example, that a silicon carbide layer having a cubic crystal structure is more likely to be epitaxially grown on the substrate if the main surface is the {0001} surface. In a case where a trench is formed by RIE that is anisotropic dry etching, sides of the trench become almost perpendicular to the main surface. Therefore, each side is inclined with respect to a low-index surface perpendicular to the {0001} surface except a surface parallel to an offset direction. In other words, there is a problem that it is difficult to control orientations of the sides of the trench such that the channel mobility is improved. The foregoing Patent Document 2 discloses that an offset angle of a main surface is limited within 5° and an angle that a side forms with respect to a {03-38} surface or a {1100} surface is limited within 10°, so that as high channel mobility as possible is obtained. In this art, however, the side is not matched with a low-order surface such as the {03-38} surface or the {1-100} surface.

Furthermore, as disclosed in FIG. 1(b) in Patent Document 1, there is a phenomenon in which a pit portion in the shape of a protrusion called "sub-trench" is created in a bottom of the trench formed by the RIE. As a result, there is a problem that, during operation of a UMOSFET, an electric field concentrates on this sub-trench portion and the breakdown voltage is degraded. In Patent Document 3, the phenomenon in which a sub-trench is created in a bottom of the trench is analyzed and gas etching that is isotropic etching is performed instead of the RIE in the final finish of etching for forming the trench, so that an angle of a tip of the sub-trench is blunt. It is practically difficult, however, that this art causes the sub-trench to be completely eliminated, and it requires a complicated process.

In addition, there is also a problem that etching damage occurs at wall portions of the trench in the silicon carbide layer when the trench is formed by the RIE, and the channel mobility of the UMOSFET is degraded.

In view of the facts that a wide flat terrace portion is grown under a certain condition and that a cubic silicon carbide layer is more likely to be epitaxially grown on a flat surface of a hexagonal silicon carbide layer, an object of the present invention is to provide a silicon carbide semiconductor device having excellent performance characteristics and a method of manufacturing the same by taking measures to match a channel region with a low-order surface of a hexagonal portion.

Means For Solving The Problems

A method of manufacturing a silicon carbide semiconductor device according to the present invention is a method of forming an extended terrace surface by heat-treating a base semiconductor layer of hexagonal crystals while providing silicon to the base semiconductor layer; epitaxially growing a new growth layer made of silicon carbide on the base semiconductor layer; forming a trench by removing a portion grown on the extended terrace surface in the new growth layer; and forming a gate electrode in the trench.

With this method, silicon carbide crystals having a cubic structure are epitaxially grown on the extended terrace surface in the new growth layer. Therefore, sides of the trench formed by removing this portion are almost perpendicular to the extended terrace surface. Thus, the sides of the trench can have a low-order surface of the silicon carbide crystals, and the channel mobility of the silicon carbide semiconductor device can be improved.

In the step of forming a trench, the portion grown on the extended terrace surface in the new growth layer is selectively removed. As a result, the trench is readily formed without creating a sub-trench.

By annealing at a temperature of 1500-1900° C., for example, the portion grown on the extended terrace surface can be selectively removed to form a trench without creating a sub-trench or causing etching damage.

In the step of forming an extended terrace surface, a coating film including Si is formed on the base semiconductor layer, and then the base semiconductor layer is heat-treated at a temperature of not lower than a melting point of the coating film. As a result, a wide extended terrace surface can be readily formed.

In particular, in a case where the base semiconductor layer has a main surface inclined at not smaller than 2° in a <1-100> direction or a <11-20> direction with respect to a {0001} surface, a polygonal coating film having at least one side orthogonal to the direction of inclination is formed. As a result, the sides of the trench formed by removing cubic crystals readily become parallel to a {11-20} surface or a {1-100} surface. Therefore, a channel region of the silicon carbide semiconductor device is also formed along the {11-20} surface or the {1-100} surface, and a semiconductor device having high channel mobility where carriers run along the low-order surface is reliably obtained.

In a silicon carbide semiconductor device according to the present invention, a new growth layer is provided by epitaxial growth on a base semiconductor layer of hexagonal crystals having an extended terrace surface at a surface, and a gate electrode is formed in a trench formed by removing a portion located on the extended terrace surface in the new growth layer.

As a result, the portion located on the extended terrace surface in the new growth layer includes silicon carbide crystals having a cubic structure, and sides of the trench formed by removing this portion is almost perpendicular to the extended terrace surface. Thus, the sides of the trench can have a low-order surface of the silicon carbide crystals, and the channel mobility of the silicon carbide semiconductor device can be improved.

In particular, the base semiconductor layer has a main surface inclined at not smaller than 2° in a <1-100> direction or a <11-20> direction with respect to a {0001} surface, and a two-dimensional shape of the trench is a polygon having at least one side orthogonal to the direction of inclination. As a result, a channel region is readily formed along the {11-20} surface or the {1-100} surface. Therefore, the carriers run along the {11-20} surface or the {1-100} surface that is the low-order surface, and the effect of the improved channel mobility can be produced reliably.

Effects of the Invention

With a silicon carbide semiconductor device according to the present invention and a method of manufacturing the same, a silicon carbide semiconductor device having high channel mobility and excellent performance characteristics can be obtained.

DESCRIPTION OF THE REFERENCE SIGNS

10 4H—SiC substrate, 11 initial growth layer (base semiconductor layer), 14A extended kink surface, 14B kink surface, 15A extended terrace surface, 15B terrace surface, 16 silicon oxide film, 21 new growth layer, 21a 3C—SiC portion, 21a1 n-type 3C—SiC portion, 21a2 p-type 3C—SiC portion, 21b 4H—SiC portion, 21b1 n-type 4H—SiC portion, 21b2 p-type 4H—SiC portion (p-well region), 23 source region, 24 p$^+$ contact region, 26 gate insulating film, 27 gate electrode, 29 source electrode, 30 drain electrode, M1 coating film, M2 carbon cap

BEST MODES FOR CARRYING OUT THE INVENTION

-Formation of Extended Terrace Surface-

Figure 1:
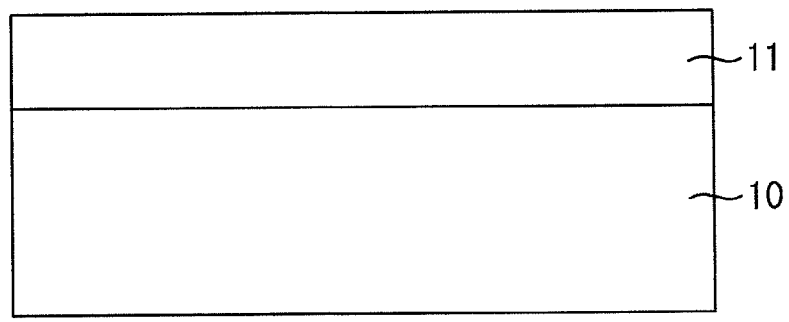
FIGS. 1(a)-(c) are cross-sectional views showing the step of forming an extended terrace surface and the step of forming a new growth layer in an embodiment.
Figure 1:
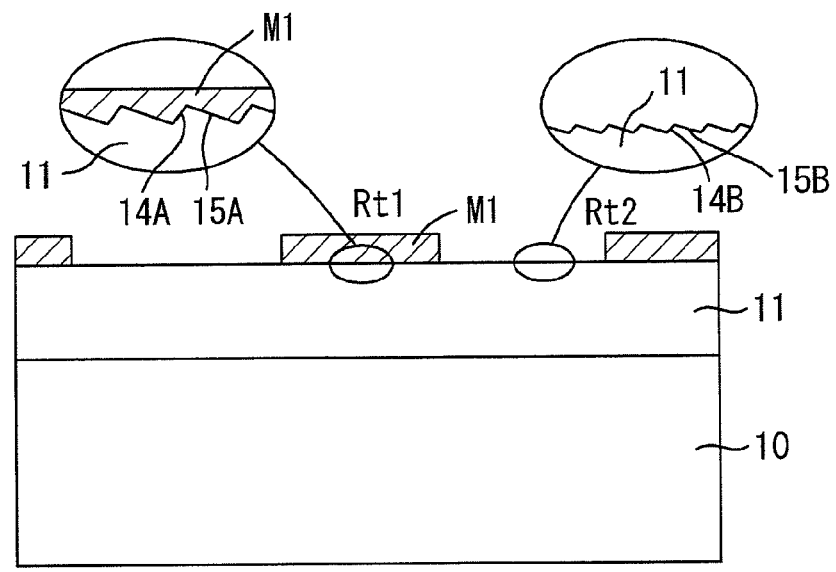
Figure 1:
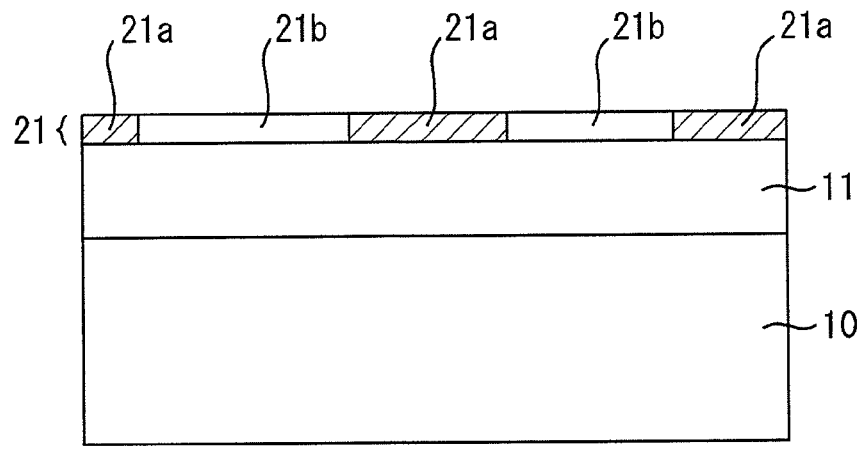

FIGS. 1(a)-(c) are cross-sectional views showing the step of forming an extended terrace surface and the step of forming a new growth layer in an embodiment.

In a step shown in FIG. 1(a), an n-type 4H—SiC substrate 10 having a resistivity of 0.02 Ωcm and a thickness of 400 µm as well as using a {0001} surface offset at about 8° in a <11-20> direction as a main surface is prepared. Then, an initial growth layer (a base semiconductor layer) 11 having a thickness of about 10 µm and including an n-type dopant having a concentration of about $1\times10^{16}$ cm$^{-3}$ is epitaxially grown on 4H—SiC substrate 10 by using the CVD epitaxial growth method with in-situ doping. At this time, a surface portion of initial growth layer 11 includes many steps having relatively regular shapes, and a surface of each step includes a kink surface and a terrace surface. The terrace surface corresponds to the {0001} surface and has a width of approximately 10 nm. The kink surface corresponds to a {11-2n} surface (where "n" is any integer) or a {03-38} surface. When a 6H—SiC substrate is used, however, the terrace surface corresponds to the {0001} surface and the kink surface corresponds to a {01-14} surface. Many steps having somewhat regular shapes are formed at the surface of initial growth layer 11. A collection of these steps is called "bunching steps." It should be noted that the 6H—SiC substrate may be used instead of the 4H—SiC substrate. Furthermore, a layer having the bunching steps formed at a surface of a silicon carbide substrate itself by heat treatment or the like may be used as the base semiconductor layer.

Next, in a step shown in FIG. 1(b), an Si film covering initial growth layer 11 is deposited, and then is patterned to form a coating film M1 covering a device formation region. It should be noted that a region that is not covered with coating film M1 may be covered with a resist film. Then, annealing is performed under certain conditions, that is, at about 1500° C. for about two hours in an atmosphere of Ar. At this time, in a region Rt1 covered with coating film M1, an extended terrace surface 15A and an extended kink surface 14A created by extending the terrace surface and the kink surface of the bunching steps are formed (see a partial enlarged view of region Rt1). Although a mechanism for formation of such extended terrace surface has not yet been fully elucidated, empirical facts show that steps having extremely extended terrace surfaces and kink surfaces are formed by annealing while Si is provided. On the other hand, in a region Rt2 that is not covered with the coating film, there are a terrace surface 15B and a kink surface 14B that are hardly extended (see a partial enlarged view of region Rt2). Extended terrace surface 15A has been extended to have a width of approximately 0.1-50 μm. Although extended terrace surface 15A has been extended to be ten times or more wider than unextended terrace surface 15B, it is not drawn to scale in the partial enlarged view in FIG. 1(b) for convenience in illustration.

Although initial growth layer 11 is annealed at 1500° C. to form extended terrace surface 15A in the present embodiment, the annealing temperature here preferably has the following range. The annealing temperature is preferably not higher than 2545° C. in order to suppress sublimation and complete decomposition of SiC. The annealing temperature is preferably not higher than 2000° C. in order to suppress sublimation of SiC into $SiC_2$, Si or $Si_2C$ to some extent. The annealing temperature is preferably not higher than 1800° C. in order to sufficiently suppress sublimation of SiC into $SiC_2$, Si or $Si_2C$ and facilitate control over the surface morphology of initial growth layer 11. The annealing temperature is preferably not higher than 1600° C. in order to further improve the surface morphology of initial growth layer 11.

Although, at the time of annealing, Si is provided to the surface of initial growth layer 11 by covering initial growth layer 11 with coating film M1 made of Si in the present embodiment, other methods can be employed instead of this method. For example, the other methods include a method of providing Si to the surface of initial growth layer 11 by flowing Si-based gas onto the surface of initial growth layer 11, a method of providing a liquid including Si to the surface of initial growth layer 11, a method of covering initial growth layer 11 with a coating film made of $SiO_2$, or the like, at the time of annealing.

Next, in a step shown in FIG. 1(c), coating film M1 is removed by using a mixture of nitric acid and hydrogen fluoride, and then a new growth layer 21 having a thickness of approximately 1 μm is epitaxially grown on initial growth layer 11 by using the CVD epitaxial growth method with in-situ doping. This new growth layer 21 includes a 3C—SiC portion 21a grown on the region that was covered with the coating film, and a 4H—SiC portion 21b grown on the region that was not covered with coating film M1. In FIG. 1(c), although 3C—SiC portion 21a grows in a direction perpendicular to extended terrace surface 15A, and therefore 3C—SiC portion 21a and 4H—SiC portion 21b have an interface inclined with respect to the substrate surface, 3C—SiC portion 21a and 4H—SiC portion 21b are depicted as if they did not have the inclined interface for convenience sake. A growth mechanism of 3C—SiC having a polytype different from 4H—SiC on a region having extended terrace surface 15A will be described hereinafter.

Figure 2:
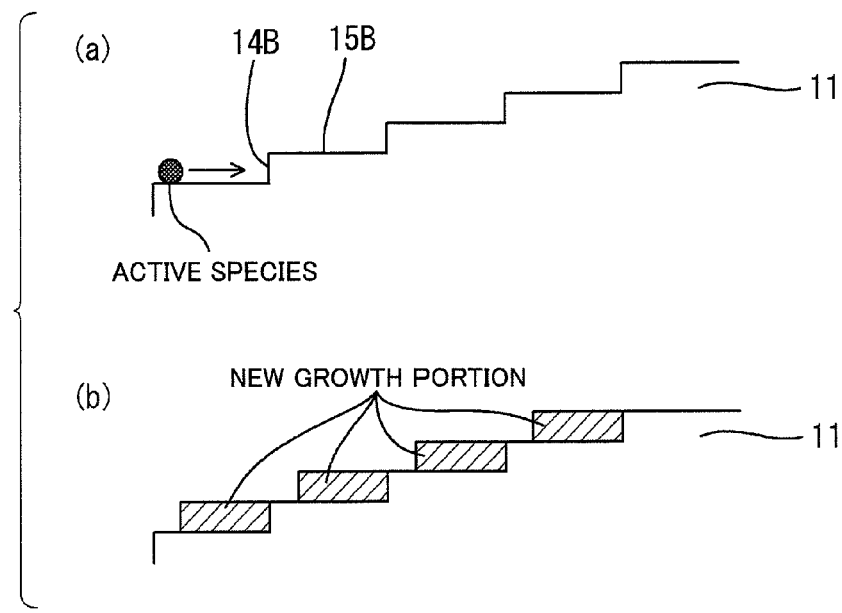
FIGS. 2(a) and (b) are diagrams of a growth mechanism in a case where, after an initial growth layer is grown, a new growth layer is further epitaxially grown without performing annealing with the initial growth layer covered with an Si film.

FIGS. 2(a) and (b) are diagrams of a growth mechanism in a case where, after initial growth layer 11 is grown, new growth layer 21 is further epitaxially grown without performing annealing with initial growth layer 11 covered with the Si film. In other words, FIGS. 2(a) and (b) show a growth mechanism in 4H—SiC portion 21b shown in FIG. 1(c). As shown in FIG. 2(a), an active species (a compound including Si and C contributing to epitaxial growth) having reached the upper surface of narrow terrace surface 15B of the bunching steps moves on terrace surface 15B and immediately reaches kink surface 14B. Then, as shown in FIG. 2(b), information about the crystal structure of the base layer (initial growth layer 11) is passed on from kink surface 14B and a new growth portion made of 4H—SiC starts to be grown (step-flow growth). In a case of SiC crystals, since there are many polytypes, good-quality homoepitaxial growth is difficult on the {0001} surface having little kink surface. Therefore, an offset substrate having a main surface offset with respect to the {0001} surface is generally used.

Figure 3:
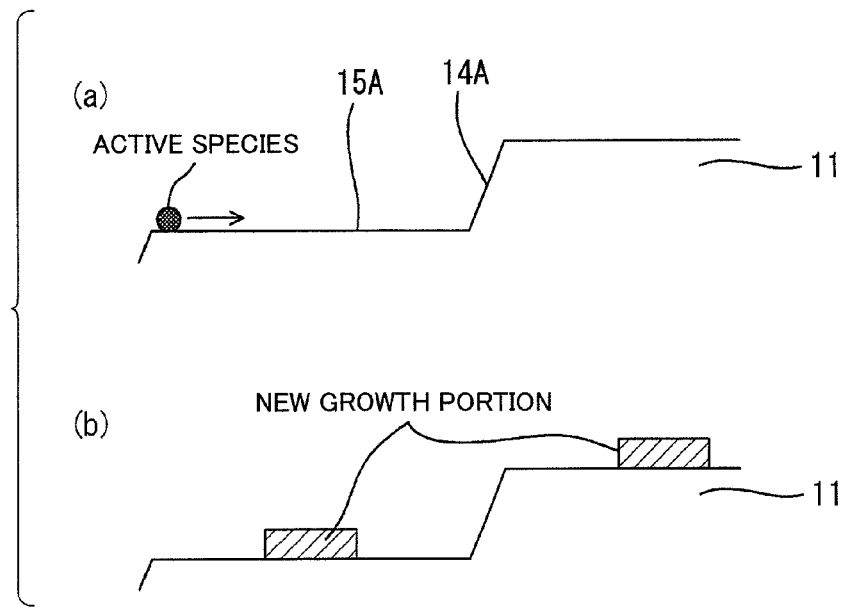
FIGS. 3(a) and (b) are diagrams of a growth mechanism in a case where, after the initial growth layer is grown, annealing is performed with the initial growth layer covered with the Si film, and then the new growth layer is epitaxially grown.

FIGS. 3(a) and (b) are diagrams of a growth mechanism in a case where, after initial growth layer 11 is grown, annealing is performed with initial growth layer 11 covered with the Si film, and then new growth layer 21 is epitaxially grown. In other words, FIGS. 3(a) and (b) show a growth mechanism in 3C—SiC portion 21a shown in FIG. 1(c). As shown in FIG. 3(a), even when the active species having reached extended terrace surface 15A moves on extended terrace surface 15A, it is less likely to reach kink surface 14A. This is because terrace surface 15 of the bunching steps has a width P1 of approximately 10 nm, whereas extended terrace surface 15A has a width of not less than the order of sub-gm (not less than 0.1 μm and not more than 50 μm). Therefore, as shown in FIG. 3(b), before the active species reaches extended kink surface 14A, crystal growth starts from the upper surface of extended terrace surface 15A (two-dimensional nucleation). In this case, the information about the crystal structure of the base layer (initial growth layer) is not passed on. Therefore, the homoepitaxial growth is less likely to occur and a new growth layer made of 3C—SiC having a polytype stable at a low temperature starts to be grown.

-Process of Manufacturing UMOSFET-

Figure 4:
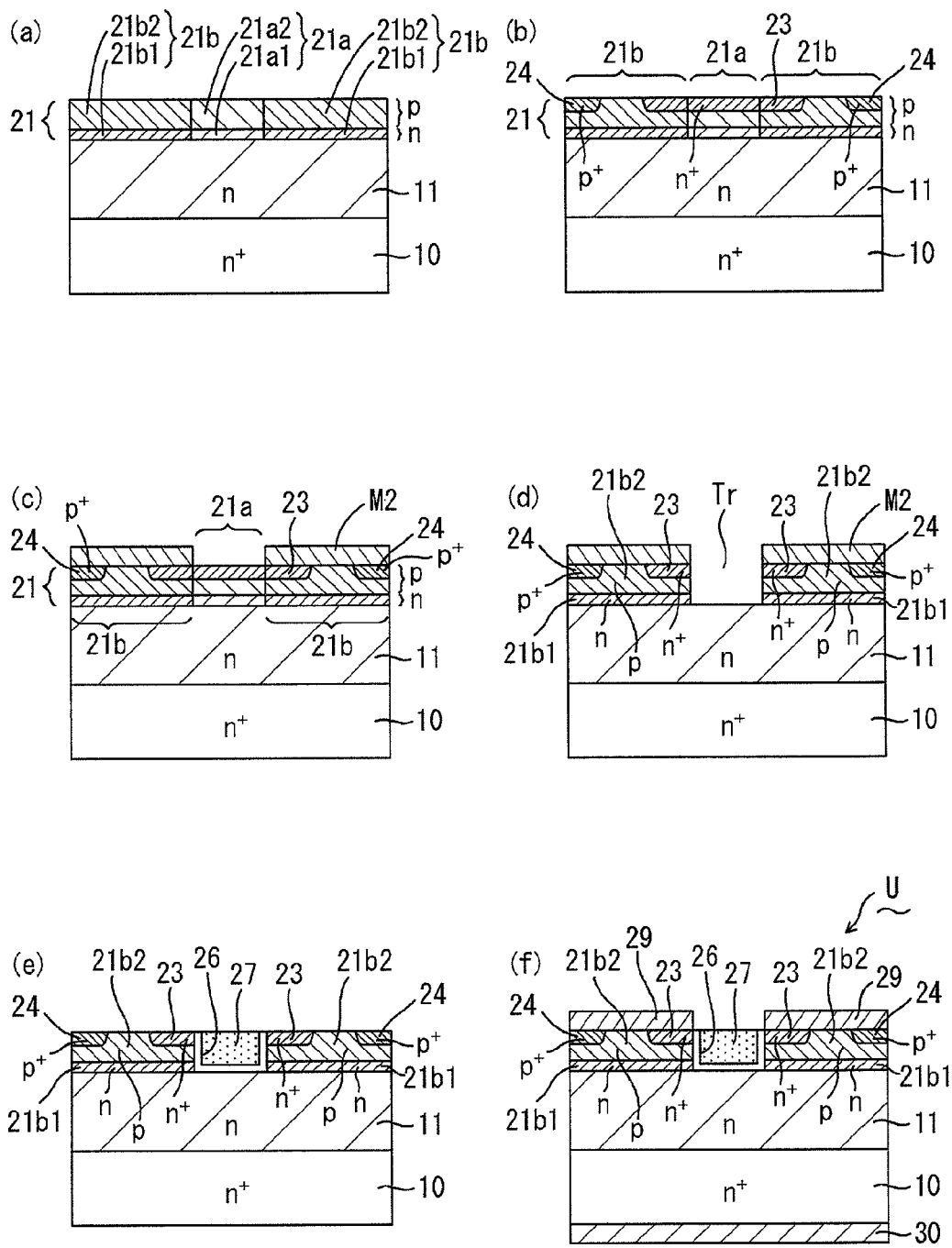
FIGS. 4(a)-(f) are diagrams showing a process of manufacturing a UMOSFET in the embodiment.

FIGS. 4(a)-(f) are diagrams showing a process of manufacturing a UMOSFET in the embodiment. In a step shown in FIG. 4(a), a structure of new growth layer 21 in the step shown in FIG. 1(c) is described in detail. In FIGS. 4(a)-(c), although 3C—SiC portion 21a grows in a direction perpendicular to extended terrace surface 15A, and 3C—SiC portion 21a and 4H—SiC portion 21b have an interface inclined with respect to the substrate surface, 3C—SiC portion 21a and 4H—SiC portion 21b are depicted as if they did not have the inclined interface for convenience sake.

As shown in FIG. 4(a), when new growth layer 21 is epitaxially grown, an n-type 3C—SiC portion 21a1 and an n-type 4H—SiC portion 21b1 having a thickness of about 0.2 μm and including an n-type dopant having a concentration of about $1 \times 10^{16}$ $cm^{-3}$ are first epitaxially grown on initial growth layer 11 by using the CVD epitaxial growth method with in-situ doping. Next, a p-type 3C—SiC portion 21a2 and a p-type 4H—SiC portion 21b2 (p-well region) having a thickness (depth) of about 0.8 μm and including a p-type dopant having a concentration of about $1 \times 10^{17}$ $cm^{-3}$ are epitaxially grown on n-type 3C—SiC portion 21a1 and n-type 4H—SiC portion 21b1.

Next, in a step shown in FIG. 4(b), a source region 23 having a thickness (depth) of about 0.3 μm and including an n-type dopant having a concentration of $1 \times 10^{19}$ $cm^{-3}$ is formed in a region extending over a surface portion of p-type 3C—SiC portion 21a2 and a surface portion of p-type 4H—SiC portions 21b (p-well regions) on both sides thereof in new growth layer 21 by using the ion implantation method. Furthermore, a $p^+$ contact region 24 having a thickness (depth) of about 0.3 μm and including a p-type dopant having a concentration of $5 \times 10^{19}$ $cm^{-3}$ is formed in a part of p-type 4H—SiC portion 21b2. It should be noted that the temperature of the substrate at the time of ion implantation is all 500° C.

Next, in a step shown in FIG. 4(c), a positive-type resist having a thickness of 2.5-3 μm is applied on the entire substrate and heat treatment is performed under certain conditions, that is, at 750° C. for 15 minutes in an atmosphere of argon to form a carbon film having a thickness of 0.8-1 μm that covers the substrate. Thereafter, the carbon film is patterned to form a carbon cap M2 where a region located on 3C—SiC portion 21a is open.

Figure 5:
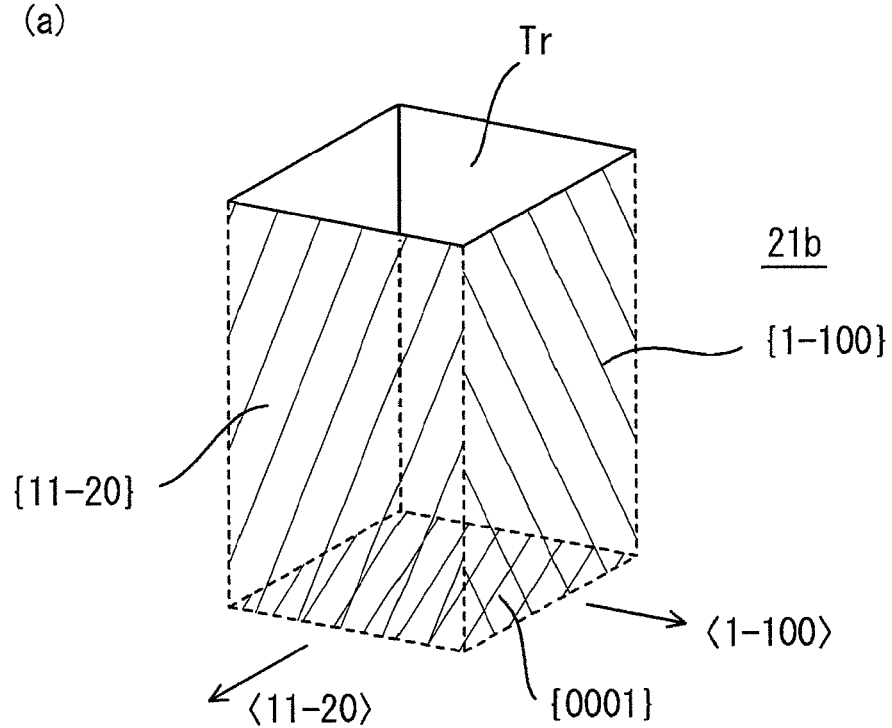
FIGS. 5(a) and (b) are perspective views of orientations of sides of a trench in the embodiment and a modification thereof.
Figure 5:
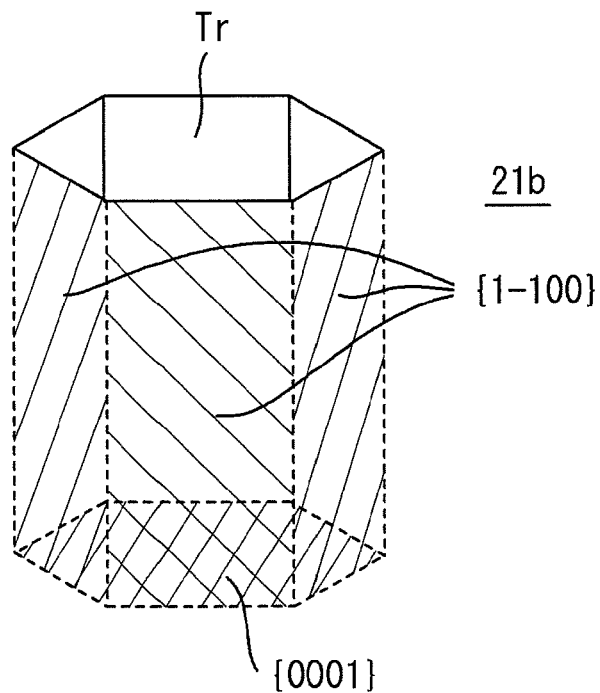

Next, in a step shown in FIG. 4(d), thermal annealing is performed under certain conditions, that is, at 1700° C. for 30-40 minutes in an atmosphere of argon with 4H—SiC portion 21b covered with carbon cap M2. As a result, 3C—SiC portion 21a is sublimed, whereas 4H—SiC portion 21b having a higher sublimation temperature than that of 3C—SiC portion 21a is not sublimed and almost all remains. In other words, in this step, 3C—SiC portion 21a is selectively removed to form a trench Tr having wall portions formed of 4H—SiC portions 21b. It should be noted that, even if a part of 4H—SiC portion 21a is removed, portions corresponding to sides of trench Tr have only to have crystallographic orientations as shown in FIG. 5(a) or 5(b) that will be described hereinafter. The appropriate annealing temperature in this annealing step is preferably not higher than 2545° C. in order to suppress sublimation and decomposition of 4H—SiC portion 21b. The annealing temperature is preferably not higher than 1600° C. in order to maintain the surface morphology of 4H—SiC portion 21b in good condition. It is seen, however, that the annealing temperature is preferably within a range of 1500-1900° C. in an actual manufacturing process because the appropriate temperature can also be adjusted depending on pressure in an atmosphere of Ar or time period.

It should be noted that carbon cap M2 is not necessarily required in order to sublime 3C—SiC portion 21a. The entire upper surface of the substrate may be open at the time of annealing. Sublimation of 4H—SiC portion 21b can, however, be prevented more reliably by covering 4H—SiC portion 21b with a mask. Instead of carbon cap M2, a mask made of a material having a higher sublimation temperature or a melting point than that of SiC such as TaC may be used. In particular, there is an advantage that surfaces of source region 23 and p$^+$ contact region 24 are smoothed to have a surface roughness Ra of approximately 1-2 nm by annealing with 4H—SiC portion 21b covered with the carbon film.

The process of selectively removing cubic 3C—SiC portion 21a with hexagonal 4H—SiC portion 21b remaining is not limited to the above-described sublimation process by annealing. For example, only a cubic portion can be selectively removed by wet etching, gas etching, RIE, or the like. In the present embodiment, however, there is an advantage that 3C—SiC portion 21a can be selectively removed just by a relatively simple process of annealing (heating treatment). In addition, there is also an advantage that a sub-trench is not created and etching damage does not occur.

Next, in a step shown in FIG. 4(e), heat treatment is performed under certain conditions, that is, at 900° C. for 30 minutes in an atmosphere of oxygen to remove carbon cap M2. Thereafter, a silicon oxide film having a thickness of about 50 nm by the dry oxidation method in which the temperature of the substrate is maintained at about 1200° C. and a polysilicon film having a thickness of about 1.2 μm are formed on the substrate. Then, the silicon oxide film and the polysilicon film are planarized by CMP or the like to form a gate insulating film 26 and a gate electrode 27 in trench Tr.

Next, in a step shown in FIG. 4(f), a drain electrode 30 formed of an Ni film and having a thickness of about 0.1 μm is formed on a back surface of 4H—SiC substrate 10 by the vapor deposition method, the sputtering method or the like. Furthermore, a source electrode 29 formed of an Ni film and having a thickness of about 0.1 μm is formed on 4H—SiC portion 21b.

Thereafter, heat treatment is performed under certain conditions, that is, at 975° C. for two minutes in an atmosphere of argon, and a state where Ni forming source electrode 29 and drain electrode 30 contacts silicon carbide forming the base layer (source region 23, p$^+$ contact region 24 and p-type 4H—SiC portion 21b2 (p-well region)) is changed from a Schottky contact to an ohmic contact.

According to the above-described manufacturing process, a UMOSFET that is an n-channel type vertical transistor and serves as a power device is formed. Many transistor cells Us are combined to constitute one UMOSFET although not shown in FIGS. 4(a)-(f). In each transistor cell U of this UMOSFET, when the UMOSFET is on, a current supplied from drain electrode 30 vertically flows from 4H—SiC substrate 10 through initial growth layer 11 and n-type 4H—SiC portion 21b1 as well as p-type 4H—SiC portion 21b2 (p-well region) to source region 23. A region of p-type 4H—SiC portion 21b2 (p-well region) adjacent to gate insulating film 26 serves as a channel region where carriers (electrons in the present embodiment) run. The mobility of the electrons in this channel region refers to the channel mobility.

FIGS. 5(a) and (b) are perspective views of orientations of the sides of the trench in the embodiment and a modification thereof. Cubic 3C—SiC portion 21a is epitaxially grown on extended terrace surface 15A almost perpendicularly to extended terrace surface 15A. Therefore, the sides of trench Tr formed by selectively removing 3C—SiC portion 21a become perpendicular to the {0001} surface because extended terrace surface 15A corresponds to the {0001} surface. In other words, the sides of trench Tr (4H—SiC portions 21b) can be controlled to have a low-order surface depending on a two-dimensional shape (orientation) of mask M1 shown in FIG. 1(b).

In the present embodiment, coating film M1 shown in FIG. 1(b) is configured to have a rectangular two-dimensional shape whose respective side has a direction parallel to a <1-100> direction or a <11-20> direction of initial growth layer 11 (base semiconductor layer). As a result, as shown in FIG. 5(a), portions corresponding to the sides of trench Tr in 4H—SiC portion 21b have a {11-20} surface or a {1-100} surface. In other words, the channel region of the UMOSFET is formed along the {11-20} surface or the {1-100} surface, and the carriers (electrons in the present embodiment) run along the low-order surface. Therefore, a UMOSFET having high channel mobility is obtained.

In the modification, coating film M1 shown in FIG. 1(b) is configured to have a hexagonal two-dimensional shape whose respective side has a direction parallel to the <1-100> direction of initial growth layer 11 (base semiconductor layer). As a result, as shown in FIG. 5(b), the portions corresponding to the sides of trench Tr in 4H—SiC portion 21b have the {1-100} surface. In other words, the channel region of the UMOSFET is formed along the {1-100} surface, and the carriers (electrons in the present embodiment) run along the low-order surface. Therefore, a UMOSFET having high channel mobility is also obtained according to the modification.

According to the embodiment and the modification described above, in a case where the base semiconductor layer (initial growth layer 11) having a main surface inclined at not smaller than 2° in the <1-100> direction or the <11-20> direction with respect to the {0001} surface is used, the carriers run along the {11-20} surface or the {1-100} surface that is the low-order surface, if coating film M1 has a polygonal two-dimensional shape where at least one side is orthogonal to the direction of inclination.

It should be noted that, in the present embodiment, a diode such as a Schottky diode or a pn diode is formed in 4H—SiC portion 21b of new growth layer 21, although illustration is not given. A diode, however, does not necessarily have to be provided on the same substrate as a transistor.

Other Embodiments

A silicon carbide semiconductor device according to the present invention is not limited to the devices described in the first and second embodiments, but can have any variations in terms of a structure, a dimension, a dopant concentration, or the like of each portion as long as the device can produce the effects of the invention.

A silicon carbide substrate that is one silicon carbide semiconductor substrate in the present invention is not limited to a 4H—SiC substrate, but may be a hexagonal SiC substrate having a polytype different from a 4H polytype, such as a 6H—SiC substrate.

Although an example in which a silicon carbide semiconductor device according to the present invention is applied to a UMOSFET have been described in the embodiment, the silicon carbide semiconductor device according to the present invention is also applicable to a device where a gate insulating film is an insulating film different from a silicon oxide film, for example a silicon nitride film, a silicon oxynitride film, other dielectric films of various types, or the like. In addition, the silicon carbide semiconductor device according to the present invention is also applicable to an IGBT or the like.

Industrial Applicability

A silicon carbide semiconductor device according to the present invention can be employed in a UMOSFET, an IGBT or the like used as a power device or a high-frequency device.

The invention claimed is:

1. A method of manufacturing a silicon carbide semiconductor device, comprising the steps of:
    (a) forming an extended terrace surface at a first part of a surface of a base semiconductor layer made of hexagonal silicon carbide, by heat-treating said base semiconductor layer while providing silicon to the first part of said base semiconductor layer, and forming an unextended terrace surface at a second part the surface of said base semiconductor layer by heat-treating said base semiconductor layer without providing silicon to the second part of the surface of said base semiconductor layer;
    (b) epitaxially growing a new growth layer made of silicon carbide on said base semiconductor layer, the new growth layer made of silicon carbide portion of a first type grown on the extended terrace surface and a silicon carbide portion of a second type grown on the unextended terrace surface;
    (c) forming a trench having a wall portion formed of the silicon portion of the second type by removing at least a portion of silicon carbide portion of the first type grown on said extended terrace surface in said new growth layer; and
    (d) forming a gate electrode in said trench after said step (c).

2. The method of manufacturing a silicon carbide semiconductor device according to claim 1, wherein
    in said step (c), the portion grown on said extended terrace surface in the new growth layer is selectively removed.

3. The method of manufacturing a silicon carbide semiconductor device according to claim 1, wherein said step (a) includes the sub-steps of
    (a1) forming a coating film including Si that covers at least a part of said base semiconductor layer, and
    (a2) heat-treating said base semiconductor layer at a temperature of not lower than a melting point of said coating film with said coating film applied.

4. The method of manufacturing a silicon carbide semiconductor device according to claim 3, wherein
    in said step (a),
    the base semiconductor layer having a main surface inclined at not smaller than 2° in a <1-100> direction or a <11-20> direction with respect to a {0001} surface is used, and
    a coating film having a polygonal two-dimensional shape where at least one side is orthogonal to said direction of inclination is formed as said coating film.

5. The silicon carbide semiconductor device according to claim 1, wherein the silicon carbide portion of the first type comprises a 3C—SiC portion and the silicon carbide portion of the second type comprises a 4H—SiC portion.

6. A method of manufacturing a silicon carbide semiconductor device, comprising the steps of:
    (a) forming an extended terrace surface at a part of a surface of a base semiconductor layer made of hexagonal silicon carbide, by heat-treating said base semiconductor layer while providing silicon to said base semiconductor layer;
    (b) epitaxially growing a new growth layer made of silicon carbide on said base semiconductor layer;
    (c) forming a trench by removing at least a portion grown on said extended terrace surface in said new growth layer; and
    (d) forming a gate electrode in said trench after said step c, wherein, in said step (c), the portion grown on said extended terrace surface in the new growth layer is selectively removed by annealing at a temperature ranging from 1500 to 1900° C.

7. A silicon carbide semiconductor device, comprising:
    a base semiconductor layer made of hexagonal silicon carbide and having an extended terrace surface and an unextended terrace surface at a surface of the base semiconductor layer;
    a new growth layer including a 4H—SiC portion epitaxially grown on the unextended terrace surface of said base semiconductor layer;
    a trench including a wall portion formed of the 4H—SiC portion formed by removing at least a portion of the new growth layer located on said extended terrace surface in said new growth layer; and
    a gate electrode formed in said trench.

8. The silicon carbide semiconductor device according to claim 7, wherein
    a main surface of said base semiconductor layer is inclined at not smaller than 2° in a <1-100> direction or a <11-20> direction with respect to a {0001} surface, and
    a two-dimensional shape of said trench is a polygon having at least one side orthogonal to said direction of inclination.

9. The silicon carbide semiconductor device according to claim 7, wherein the portion of the new growth layer located on said extended terrace surface in said new growth layer comprises a 3C—SiC portion.

* * * * *